Oct. 12, 1965 J. E. RILEY 3,211,583
PYROLYTIC DEPOSITION OF GERMANIUM
Filed Sept. 19, 1961
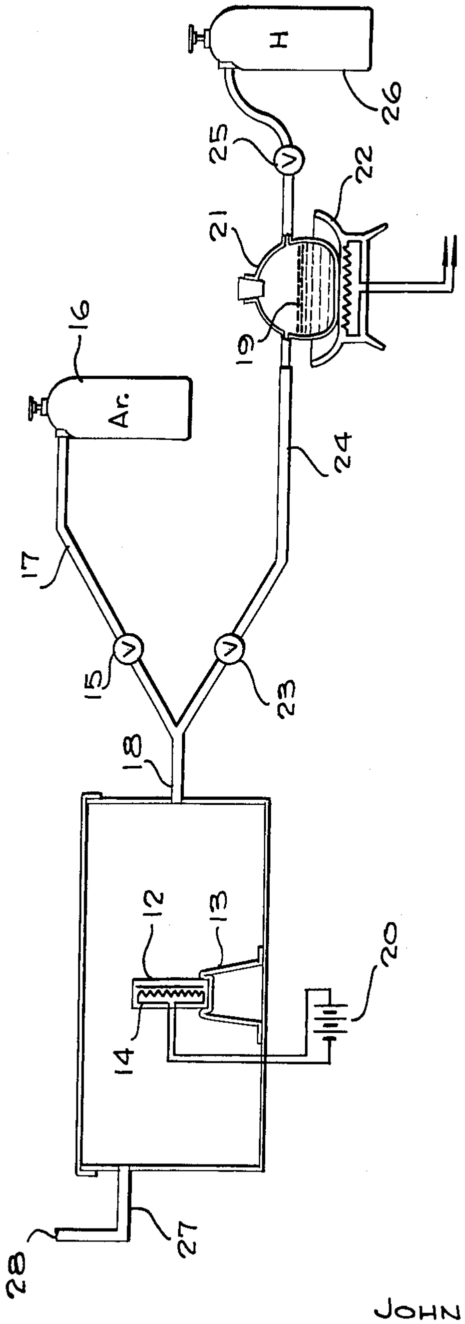
INVENTOR
JOHN E. RILEY
BY Hurvitz and Rose
ATTORNEYS

United States Patent Office 3,211,583

Patented Oct. 12, 1965

3,211,583

PYROLYTIC DEPOSITION OF GERMANIUM

John E. Riley, Vienna, Va., assignor to Melpar, Inc., Falls Church, Va., a corporation of Delaware Filed Sept. 19, 1961, Ser. No. 140,638
1 Claim. (Cl. 117—227)

The present invention relates generally to pyrolytic deposition methods and more particularly to a method for depositing the semiconductor metal germanium by pyrolytic deposition of a germanium-organic compound on a substrate.

Generally in the past, the semiconductor metal germanium has been deposited on substrates to form semiconductors by vacuum deposition. The semiconductor metal to be deposited must be volatilized and subsequently condensed on a cool substrate surface to form the thin deposit.

One disadvantage attendant with this previous process is the great heat and high vacuum necessary to perform it. Also, a poor junction is frequently formed between the deposited germanium and the substrate because of poor adhesion between the two materials. Poor adhesion results, apparently, from the extreme temperature difference between the vaporized germanium and cool substrate. Vacuum metalizing is frequently very time consuming, thus reducing the efficiency of each manufacturing machine since the number of elements fabricated is restricted severely. The limited germanium deposition thickness obtainable by the vacuum process prohibits manufacture of certain semiconductor elements by this method. In depositing metals with the vacuum process, coating of complex shapes, as is necessary to manufacture certain semiconductor devices, is frequently very difficult.

Accordingly, it is an object of the present invention to provide a new and improved method for depositing the semiconductor metal germanium on a substrate.

It is a further object of the present invention to provide a new and improved method for depositing germanium on a substrate wherein the necessity for a vacuum chamber and extreme heating of the metal for vaporization are obviated.

An additional object of the present invention is to provide a new and improved method for forming a thin film on a substrate wherein the product formed possesses characteristics to enable it to function as a semiconductor in electronic applications and wherein great adhesion exists between the film and the substrate.

A further object is to provide a semiconductor deposition process wherein the metal is uniformly deposited on substrates of complex shapes, which arise in certain semiconductor products.

Basically, the present invention contemplates the solution of these objects by employing a vaporized organic-germanium compound which is directed toward the substrate upon which the deposit is to be formed. When manufacturing semiconductor films, the substrate is preferably quartz or alumina but it is to be understood it may consist of any material which is desired to be plated, as long as the material is capable of being heated sufficiently to cause decomposition of the vaporized compound when proximate to the material. The organic-germanium compound is preferably an alkyl germanium, such as tetraethylgermanium.

It is a feature of the present invention that the organic-semiconductor metal need only be heated to its vaporization temperature, e.g. tetraethylgermanium vaporizes at 75° C., and the substrate heated to the decomposition temperature of the compound. Optimum substrate temperatures when utilizing tetraethylgermanium, as the compound to be decomposed, are between 550° and 650° C. Decomposition of the organo-germanium compound takes place either at or in proximity to the heated substrate and results in decomposition of the semiconductor metal on the substrate.

The adhesion properties of the elemental germanium to the substrate have been found to be of very high quality. It is postulated this results from deposition of the germanium by molecular thickness on the substrate. As the germanium deposits on the substrates, crystal structures are formed of sufficient size to perform semiconductor functions.

It is a further feature of the present invention that there is no necessity to employ costly high vacuum or high pressure equipment for depositing germanium on the substrate. The need for such equipment is obviated because the deposition of germanium is accomplished by means of a carrier gas, e.g. hydrogen, which directs the vaporized organo-germanium compound to the heated substrate. The carrier is applied to the deposition chamber at approximately one half atmosphere above normal, combines with the freed organic radical after decomposition and is withdrawn on the opposite side of the chamber from which it enters.

It is a further feature of the present invention that the germanium is deposited relatively rapidly, e.g. ten minutes to form a usable semiconductor thin film, thus permitting maximum efficiency of the decomposing chambers and the associated apparatus. Thereby, the cost of each plating operation is minimized and the overall expense for machinery and fabrication is reduced.

Another feature of the present invention is the ability to germanium coat very intricately shaped bodies, which frequently result in composite semiconductor products. This is in sharp distinction to coating of such bodies by previous methods, particularly vacuum deposition.

The above and still further objects, features and advantages of the present invention will become apparent upon consideration of the following detailed description of one specific embodiment thereof, especially when taken in conjunction with the accompanying drawings, wherein:

The figure is a schematic representation for carrying out the process.

The figure discloses a closed chamber 11 in which the substrate 12 to be plated is placed on a support 13 which is heated by resistance heater 14, which is energized by battery 20. As heating of substrate 12 is initiated, valve 15 is opened and dry argon gas from chamber 16 is supplied to chamber 11 via conduits 17 and 18 to purge air and moisture from chamber 11.

While substrate 12 is being heated and chamber 11 purged, the fluid organo-germanium compound 19, located in chamber 21, is heated to vaporization temperature by heating mantle 22. During this process valve 23, located in conduits 18 and 24 between chambers 11 and 19, is closed to prevent passage of the vapors in chamber 21 to chamber 11 and substrate 12. When the substrate 12 is sufficiently heated so that the vaporized organo-germanium compound will decompose when brought in proximity to it, and chamber 11 is sufficiently purged, valve 15 is closed to prevent the further flow of argon to the chamber. At this time, valve 25, located between chamber 21 and chamber 26, containing a carrier gas such as hydrogen, is opened. Valve 23 is also now opened and the vaporized organic germanium compound 19 is carried via conduits 24 and 18 to the surface of the substrate 12 by the released hydrogen gas.

Substrate 12 is sufficiently heated to cause decomposition of the vaporized compound 19 as it strikes or comes in very close proximity to the substrate. Of course substrate 12 must be able to withstand the temperatures necessary to decompose the organo-germanium compound without materially altering its characteristics. As the semiconductor metal decomposes, it is deposited on substrate 12 in molecular thickness. The freed organic radical combines with the hydrogen carrier and is vented from chamber 11 by being driven through outlet conduit 27 to the chamber exit 28 by the positive pressure bias supplied to chamber 11 by the hydrogen gas carrier. The positive bias is approximately one half atmosphere above normal atmosphere, thereby obviating the necessity to utilize any special pressurizing equipment with chamber 11, as is necessary to maintain a high pressure or vacuum therein. It has been found that deposition occurs between chamber pressures of −0.5 to +1.0 atmospheres and that optimum deposits result in the 0.0 to +0.5 atmosphere range.

The process is continued until the desired amount of germanium is deposited on substrate 12. To deposit a predetermined thickness of the germanium, the time of the process and temperature of the substrate must be determined empirically. The process is permitted to continue only until a coating of the desired thickness on substrate 12 is formed. Molecular germanium is deposited on the substrate and forms crystal structures of sufficient size as to be utilized for most semiconductor applications. Adherence qualities of the deposit on the substrate are quite good, probably because of the molecular germanium deposition. Of course it is to be understood that if it is desired to form a thicker layer of semiconductor on the substrate, the process is continued for the necessary time.

In forming thin film semiconductors, the substrate 12 must be able to withstand the temperature necessary to decompose the organo-germanium compound, must be inert to the film being formed, must be a high resistivity material, such as a glass or crystal, and is preferably quartz ($SiO_2$) or alumina ($Al_2O_2$). The compound 19, in a preferred embodiment, is tetraethylgermanium $Ge(C_2H_5)_4$. With tetraethylgermanium as the organic semiconductor compound 19, the quartz or alumina substrate 12 may be heated to only 400° C. to decompose the compound 19 which must be heated to 75° C. in chamber 21 to vaporize it. Sufficient quantities of molecular germanium are deposited on substrate 12 at this temperature in ten minutes to form the desired plating thickness for forming a semiconductor thin film on substrate 12. It has been found that 550°–650° C. is the optimum temperature range for substrate 12 from the standpoint of deposition time and cost of running the equipment. The ethyl radicals combine with the hydrogen carrier to form ethane ($C_2H_6$) which is driven from chamber 11 to the chamber exit 28 by the positive pressure bias, discussed previously. By this process a thin high-resistivity collector region is deposited on the very low resistivity substrate 12 of the same impurity type as the deposited germanium.

The germanium thin film deposited on the substrate is utilizable for forming a thin film field effect device. In this device, the germanium film exhibits a modulation of conductance under the influence of a transverse electric field. In the most simple form, the germanium film is deposited on the substrate between two previously applied metal contact tabs. A thin dielectric material is then deposited on the germanium film followed in turn by the deposition of a thin metal film on top of the dielectric such that a capacitor is formed. The germanium film serves as one plate of the capacitor and the metal film as the other plate. By applying a potential to the metal plate (the field plate) a change in conductance appears in the germanium film. By passing a D.C. current through the germanium film the modulating conductance will result in a modulate current and voltage across a load of the same characteristics as the input potential on the field plate.

Other organic germanium compounds, such as phenylgermanium or other alkyl-germanium compounds may be utilized as long as they vaporize and decompose at relatively low temperatures in chambers under approximately atmospheric pressure.

It has also been found that certain semiconductors are formed by utilizing a pair of vaporization chambers, each containing a separate semiconductor organic compound. Both compounds are vaporized and simultaneously applied to the purged decomposition chamber in the manner described for the single compound.

The described process may be practiced to form semiconductor products with all vaporized germanium organic compounds wherein the organic radical is decomposible from the metal and is practical with those compounds having decomposition temperatures up to 1100° C. at substantially atmospheric pressure.

While I have described and illustrated one specific embodiment of my invention, it will be clear that variations of the details of construction which are specifically illustrated and described may be resorted to without departing from the true spirit and scope of the invention as defined in the appended claim.

I claim:

The method of manufacturing a thin film field effect transistor having a germanium semi-conductor layer deposited on a glassy substrate comprising the steps of heating said substrate to a temperature in the range between 550° and 650° C. in an atmosphere purged of water and air, vaporizing a compound consisting of tetraethylgermanium, depositing said layer of germanium on said substrate by directing said vaporized tetraethylgermanium onto said substrate in an atmosphere of between −0.5 to +1.0 atmosphere by supplying hydrogen carrier gas to said vaporized compound, said vaporized compound with said carrier gas being directed onto said substrate for approximately 10 minutes so that a layer of molecular thickness of germanium is formed on said substrate by decomposition of the vaporized tetraethylgermanium to provide said semi-conductor layer, and venting ethane that forms when ethyl radicals from the decomposed tetraethylgermanium combine with the hydrogen carrier.

References Cited by the Examiner

UNITED STATES PATENTS

| | | | |
|---|---|---|---|
| 2,516,058 | 7/50 | Lander | 117—107.2 X |
| 2,556,991 | 6/51 | Teal | 117—107.2 XR |
| 2,898,235 | 8/54 | Bulloff. | |
| 2,701,216 | 2/55 | Seiler | 117—200 |
| 2,759,855 | 8/56 | Medcalf et al. | 117—107.2 X |
| 2,831,784 | 4/58 | Gastinger | 117—107.2 X |
| 2,859,132 | 11/58 | Novak et al. | 117—107.2 |
| 2,927,004 | 3/60 | Girardot | 75—62 XR |
| 3,031,338 | 4/62 | Bourdeau | 117—107.2 X |

RICHARD D. NEVIUS, *Primary Examiner.*